US006342114B1

(12) United States Patent
Lam et al.

(10) Patent No.: US 6,342,114 B1
(45) Date of Patent: Jan. 29, 2002

(54) NICKEL/VANADIUM SPUTTERING TARGET WITH ULTRA-LOW ALPHA EMISSION

(75) Inventors: Raymond K. F. Lam, Park Ridge, NJ (US); Tony Sica, Mt. Vernon, NY (US)

(73) Assignee: Praxair S.T. Technology, Inc., North Haven, CT (US)

( * ) Notice: Subject to any disclaimer, the term of this patent is extended or adjusted under 35 U.S.C. 154(b) by 0 days.

(21) Appl. No.: 09/283,084

(22) Filed: Mar. 31, 1999

(51) Int. Cl.[7] .......................... C23C 14/34; H01F 41/18
(52) U.S. Cl. ................... 148/556; 148/555; 204/298.13
(58) Field of Search ................................ 148/556, 555; 204/298.13

(56) References Cited

U.S. PATENT DOCUMENTS

| | | | | |
|---|---|---|---|---|
| 4,552,820 A | * | 11/1985 | Lin et al. | 428/611 |
| 4,814,053 A | * | 3/1989 | Shimokawato | 204/192.15 |
| 4,895,592 A | * | 1/1990 | Hatwar et al. | 75/10.14 |
| 5,334,267 A | | 8/1994 | Taniguchi et al. | 148/425 |
| 5,468,305 A | | 11/1995 | Uchida et al. | 148/120 |
| 5,667,658 A | * | 9/1997 | Koop et al. | 205/50 |
| 5,876,861 A | * | 3/1999 | Kondo et al. | 428/641 |
| 5,993,575 A | * | 11/1999 | Lo et al. | 148/577 |
| 6,086,725 A | * | 7/2000 | Abburi et al. | 204/192.1 |

FOREIGN PATENT DOCUMENTS

| | | |
|---|---|---|
| JP | 11036065 | 9/1999 |

* cited by examiner

*Primary Examiner*—Sikyin Ip
(74) *Attorney, Agent, or Firm*—Blake T. Biederman

(57) ABSTRACT

A nickel/vanadium sputter target for depositing magnetic nickel is provided having high homogeneity, high purity and an ultra-low level of alpha emission. Source materials having high purity and alpha emissions of equal or less than $10^{-2}$ counts/cm$^2$-hr are melted and cast under a vacuum and low pressure, hot or cold rolled, and heat treated to form a sputter target having an alpha emission of equal or less than $10^{-2}$counts/cm$^2$-hr, and preferably less than $10^{-3}$ counts/cm$^2$-hr. From this target may be deposited a thin film of magnetic nickel having an alpha emission equal or less than $10^{-2}$ counts/cm$^2$-hr, preferably less than $10^{-3}$ counts/cm$^2$-hr and more preferably less than $10^{-4}$ counts/cm$^2$-hr.

24 Claims, 4 Drawing Sheets

NICKEL/VANADIUM SPUTTERING TARGET WITH ULTRA-LOW ALPHA EMISSION

FIELD OF THE INVENTION

This invention relates to nickel/vanadium sputtering targets having high homogeneity, high purity and ultra-low levels of alpha emissions.

BACKGROUND OF THE INVENTION

As a feature size of microcircuit structures are reduced, the quantity of critical electronic charge, which is used to represent a single "bit" (0 or 1) in binary code, is significantly decreased. A single alpha particle passing through the circuit element can adversely affect a minute amount of electronic charge and cause bit flips from one binary number to the other. The alpha particles are emitted from naturally occurring isotopes/impurities of raw materials that comprise the microchip.

Ni/7 wt. % V is the standard composition for use with direct current magnetron sputtering systems to deposit magnetic nickel. Nickel/vanadium (Ni/V) is employed as a barrier/adhesion layer for under-bump metals to support flip chips, or C4 (collapsed, controlled, chip connection) assemblies. The flip chips allow high I/O counts, good speed and electrical performance, thermal management, low profile, and the use of standard surface mount and production lines for assembly. Low alpha emitting nickel/vanadium sputtering targets are of paramount importance to thin film deposition with zero bit error in microcircuits. Nickel/vanadium sputtering targets currently available contain alpha emissions too high for satisfactory performance in microcircuits.

There is thus the need to develop a high purity, ultra-low alpha emission nickel/vanadium sputter target, and method for producing said target, sufficient for use in the thin film deposition of magnetic nickel on microcircuits and semiconductor devices.

SUMMARY OF THE INVENTION

The present invention provides a nickel/vanadium sputter target having an alpha emission of equal or less than $10^{-2}$ counts/cm$^2$-hr, and preferably equal or less than $10^{-4}$ counts/cm$^2$-hr. To this end, and in accordance with the principles of the present invention, nickel and vanadium source materials of alpha emission equal or less than $10^{-2}$ counts/cm$^2$-hr are melted and cast under vacuum and low pressure atmosphere. The cast ingot is cut into a workpiece, rolled to final target thickness and annealed to form an ultra-low alpha emission sputter target.

In a further feature of the present invention, the nickel source material has a purity of at least about 99.98% and the vanadium source material has a purity of at least about 99.5%, such that the sputter target produced therefrom has a purity of at least 99.98%. Further, the target is cast, rolled, and annealed such that a uniform distribution of vanadium and impurities is obtained in the nickel.

These and other objects and advantages of the present invention shall become more apparent from the accompanying drawings and description thereof.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the principles of the invention.

DETAILED DESCRIPTION

Figure 1:
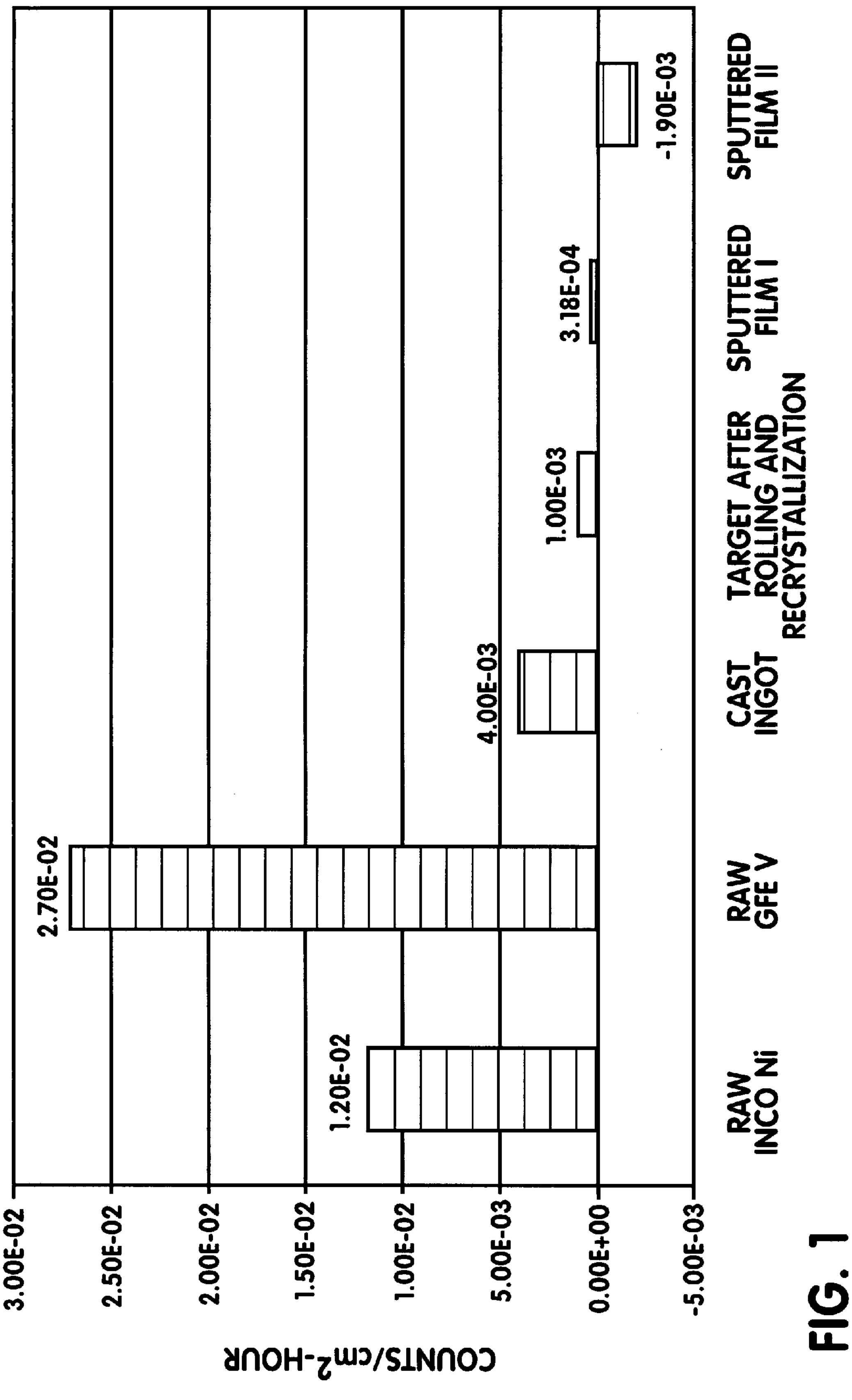
FIG. 1 is a plot of the alpha emissions during the manufacturing and use of a sputter target of the present invention.

The present invention provides a nickel/vanadium sputtering target having an ultra-low emission of undesirable radioactive alpha particles, and a method for fabricating the sputter targets.

The first step of the present invention is to provide source materials of nickel and vanadium having low alpha particle emissions and low levels of impurities. The nickel source material is preferably at least 99.98% pure with an alpha emission equal or less than about $10^{-2}$ counts/cm$^2$-hr, and the vanadium source material is preferably at least 99.5% pure with an alpha emission equal or less than about $10^{-2}$ counts/cm$^2$-hr. Acceptable commercially available products include 99.99% Mirotech nickel (actual purity of about 99.995% to about 99.9996%), Mirotech, Inc., Ontario, Canada; 99.98% INCO nickel (actual purity of about 99.99% to about 99.9997%), INCO Alloys International Inc., Huntington, W.Va.; and 99.9% GfE vanadium (actual purity of about 99.8% to about 99.95%), GfE Metalle Und Materialien GmbH, Nuremberg, Germany. INCO nickel and GfE vanadium, for example, have alpha emissions of about $1.2\times10^{-2}$ and $2.7\times10^{-2}$ counts/cm$^2$-hr, respectively.

The next step in the present invention is providing a manufacturing route that produces a high purity sputter target having a homogenous composition in terms of the distribution of the vanadium alloying element and the impurities, and that maintains or lowers the low levels of alpha radioactivity of the source materials. To this end, and in accordance with the principles of the present invention, the nickel and vanadium source materials are melted under a high vacuum and low pressure atmosphere to form a molten alloy. The vacuum is preferably a high vacuum of about $1.0\times10^{-4}$ mTorr to about 10.0 mTorr, and more preferably about 1.0 mTorr to about 5.0 mTorr, and the low pressure atmosphere is preferably a low pressure argon atmosphere of about 0.1 to about 0.7 atm., and more preferably about 0.3 atm. The melting of the nickel and vanadium source materials is preferably conducted in a semi-continuous vacuum melter (SCVM). The standard composition in the industry for depositing magnetic nickel is 7wt. % vanadium. It is to be understood, however, that the processing route as described herein may be used to fabricate nickel/vanadium sputter targets having a vanadium content less than or greater than 7wt. %. Because the purity and alpha emission for the nickel and vanadium source materials differ, however, higher or lower vanadium contents may affect the purity and alpha emission of the target and the films sputtered therefrom. In particular, higher impurity and alpha emission levels are likely with higher vanadium content.

Once a molten alloy is formed, the alloy is cast into a mold under a low pressure atmosphere. The mold may be selected from the group consisting of steel, graphite and ceramic molds. The low pressure atmosphere is preferably an argon atmosphere of 0.1 to about 0.7 atm., and more preferably about 0.3 atm. Further, the molten alloy is preferably cast into the mold in a SCVM. Upon solidification, a solid alloy ingot is formed. This ingot will also have an alpha emission equal or less than about $10^{-2}$ counts/cm$^2$-hr, and preferably even less than that of the source materials (less than about $10^{-3}$ counts/cm$^2$-hr).

From this ingot, a workpiece or target blank is cut, preferably having a diameter from about 7.0 inches to about 7.375 inches, more preferably about 7.25 inches, and a thickness of about 1.625 inches to about 1.875 inches, more preferably about 1.75 inches.

The workpiece or target blank is then rolled to a thickness reduction of about 50% to about 95%. The workpiece may be hot rolled at a temperature of about 500° C. to about 1200° C. or may be cold rolled, typically at room temperature. The rolling operation creates a texture or certain pattern of crystal orientations. The texture affects how atoms are ejected from a sputter target. The angular distribution of sputtered particles from a target determines film thickness uniformity. The rolling therefore plays a role in changing the texture, and the texture in turn affects the angular distribution of sputtered particles and subsequently the film thickness uniformity. Thus, the rolling process is designed to achieve the fine grain structure desired in sputter targets for uniform sputtering. The circular target blank may be cross-rolled, whereby the target blank is rotated approximately 45° to 90° after each rolling pass to maintain the circular shape, until the final thickness is achieved. Alternatively, the target blank may be directional-rolled, whereby the circular target blank is rolled in one direction until the width reaches an intermediate thickness, then cross-rolled to a circular shape having the desired final thickness. Although both hot and cold rolling may be used in the method of the present invention, it is believed that cold rolling will produce a finer grain in the final product.

Finally, the rolled workpiece or target blank is then recrystallization annealed at a temperature of about 600° C. to about 1000° C. for a period of about 30 minutes to about 6 hours to form a target having an alpha emission equal or less than about $10^{-2}$ counts/cm$^2$-hr, and preferably even less than the source materials and the ingot (less than about $10^{-3}$ counts/cm$^2$-hr). Preferably, the target blank is recrystallization annealed at a temperature of about 825° C. to about 875° C. for about 2 to about 4 hours. A fine grain structure is obtained by the method f the present invention, particularly where the target blank is cold cross-rolled followed by recrystallization annealing at about 825° C. to about 875° C. for about 2 to about 4 hours.

This rolled and annealed target may then be ground and machined to the final dimensions required for the particular sputter target application, followed by bonding to a backing plate to form a complete target assembly.

The sputter targets manufactured according to the above method were highly homogenous in the distribution of both the vanadium alloying element and the impurities. Furthermore, the fabricated targets maintained or even reduced the ultra-low levels of alpha radioactivity present in the source materials. The thin films sputtered from the targets manufactured by the above method also displayed ultra-low alpha particle emission, specifically, equal or less than $10^{-2}$ counts/cm$^2$-hr, and even equal or less than about $10^{-3}$ counts/cm$^2$-hr. FIG. 1 depicts the approximate alpha emission at every step in the manufacturing process, as well as that of the sputtered film. FIG. 1 shows that the alpha emissions are not constant throughout the manufacturing process, but rather decrease during manufacture. The sputtering process itself also appears to be such that the alpha emitting particles may not be completely transferred from the target to the wafer during sputtering, resulting in even lower alpha emission in the deposited thin film.

Also, the purity level of the final target product was higher than 99.98%. In use, the sputter targets manufactured by the method of the present invention produced zero damaged microcircuits due to alpha emission. Furthermore, signal error in microcircuits caused by alpha emission was eliminated.

EXAMPLES

Example 1

Figure 2:
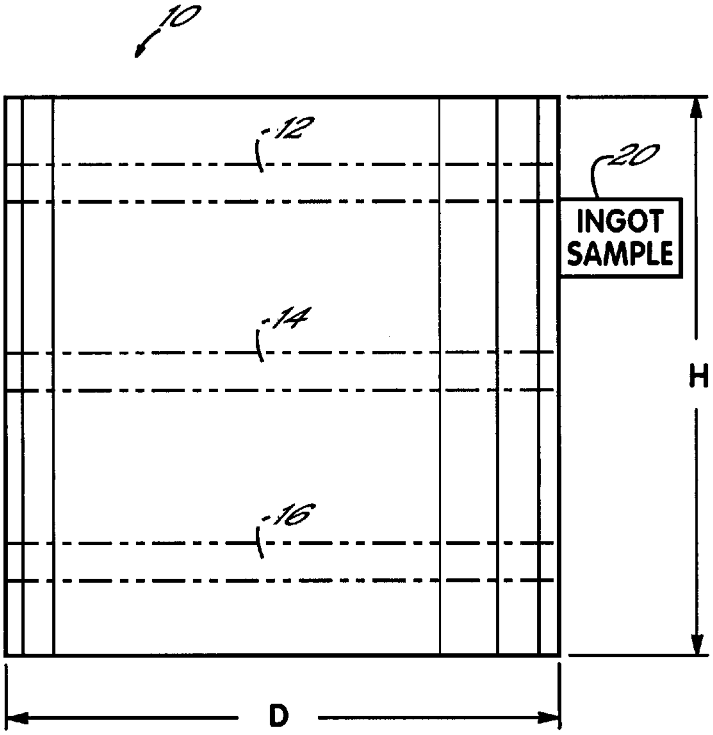
FIG. 2 is a nickel/vanadium ingot before dissecting to determine the distribution of the alloying element and impurities.
Figure 3:
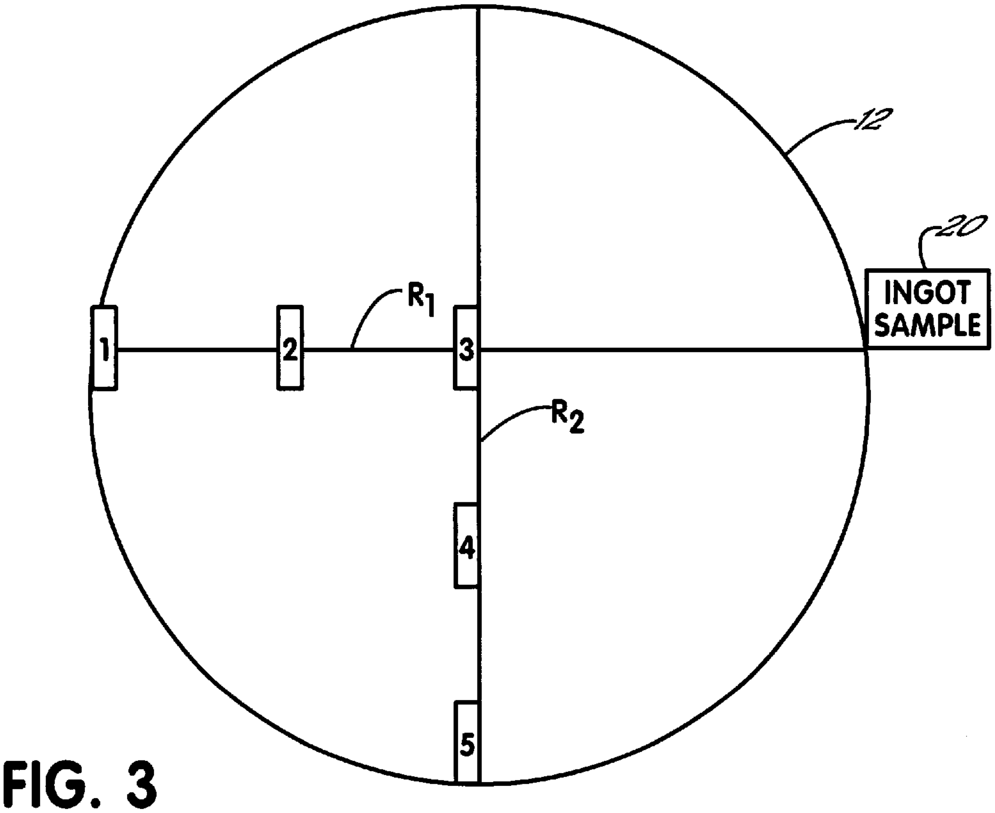
FIG. 3 is a top plan view of a sample slice taken from the ingot of FIG. 2.

A Ni/7%V ingot was made by combining 99.98% pure INCO nickel with 99.9% pure GfE vanadium, melting under a high vacuum of 5 micrometers or less and under a low pressure argon atmosphere of 0.3 atm. in a SCVM, and casting into a steel mold under a low pressure argon atmosphere of 0.3 atm. in a SCVM. The ingot was dissected to determine the distribution of the alloying element and impurities. FIG. 2 depicts ingot 10 of 7 inch diameter D and 8.25 inch height H from which three slices 12,14,16 and an ingot sample 20 were removed. The top slice 12 is taken at ¼ inch from the top surface of ingot 10, the middle slice 14 is extracted 3⅝ inches from the bottom of top slice 12, and the bottom slice 16 is removed at ¼ inch from the bottom of ingot 10. Five samples are taken from each slice, and they are taken at two radii $R_1$, $R_2$ perpendicular to each other. FIG. 3 shows sample 1 and 5 are taken from the edge of the slice, sample 3 from the center, and samples 2 and 4 from the mid-sections of the radii $R_1$, $R_2$, respectively. Table 1 lists the impurity results, as measured by a Glow Discharge Mass Spectrometer (GDMS) for the ingot sample, including the statistical results of mean, standard deviation, sample variance and range. It is typical in the industry to characterize the entire ingot, from which multiple targets are produced, by the chemistry of the ingot sample. The mean and standard deviation of %V is 7.00% and 0.0509%, respectively, and there is no segregation of the alloying element in the ingot. Table 2 lists the impurity results for the 5 samples in each of the three slices 12,14,16 as compared to the measurements for the ingot sample. The impurities are also evenly distributed in the ingot. It is also noted that the mean of all the samples has a similar value as that of the ingot sample. Thus, it is demonstrated that the ingot sample gives a good representation of the entire ingot.

TABLE 1

| | Ingot Sample | Mean | Standard Deviation | Sample Variance | Range |
|---|---|---|---|---|---|
| % V | 7.10 | 7.00 | 0.0509 | 0.002592 | 0.15 |
| % Ag | 0.180 | 0.322 | 0.0892 | 0.00797 | 0.384 |
| % Al | 15.600 | 12.493 | 0.6341 | 0.402 | 2.5 |
| % As | 0.032 | 0.027 | 0.009077 | 8.25E−05 | 0.026 |
| % B | 0.239 | 0.081 | 0.07054 | 0.00497 | 0.24 |

TABLE 1-continued

| | Ingot Sample | Mean | Standard Deviation | Sample Variance | Range |
|---|---|---|---|---|---|
| % Be | 0.005 | 0.010 | 1.76E−10 | 3.09E−20 | 0 |
| % Bi | 0.030 | 0.033 | 0.00454 | 2.07E−05 | 0.014 |
| % Ca | 0.030 | 0.052 | 0.0302 | 0.000917 | 0.11 |
| % Cd | 0.050 | 0.088 | 0.0448 | 0.00201 | 0.14 |
| % Co | 27.400 | 26.200 | 1.67 | 2.79 | 7 |
| % Cr | 12.300 | 11.566 | 0.423 | 0.1795 | 1.3 |
| % Cu | 0.372 | 0.460 | 0.372 | 0.139 | 1.51 |
| % Fe | 9.080 | 8.920 | 0.56 | 0.313 | 2.2 |
| % Ga | 0.040 | 0.040 | 7.04E−10 | 4.96E−19 | 0 |
| % In | 0.030 | 0.030 | 0.00 | 0.00 | 0.00 |
| % K | 0.034 | 0.039 | 0.0268 | 0.00072 | 0.08 |
| % Li | 0.005 | 0.010 | 1.76E−10 | 3.10E−20 | 0 |
| % Mg | 1.520 | 1.210 | 0.109 | 0.012 | 0.31 |
| % Mn | 0.080 | 0.073 | 0.0085 | 7.34E−05 | 0.03 |
| % Mo | 0.944 | 1.110 | 0.102 | 0.0105 | 0.45 |
| % Na | 0.221 | 0.257 | 0.07516 | 0.00564 | 0.266 |
| % Pb | 0.191 | 0.198 | 0.0286 | 0.00082 | 0.11 |
| % Sb | 0.010 | 0.012 | 0.00318 | 1.01E−05 | 0.01 |
| % Si | 19.400 | 21.853 | 4.022 | 16.18 | 12.2 |
| % Sn | 0.066 | 0.152 | 0.3457 | 0.1195 | 1.35 |
| % Th | 0.00070 | 0.00072 | 0.000437 | 1.91E−07 | 0.0018 |
| % Ti | 1.160 | 1.456 | 0.6026 | 0.363 | 2.5 |
| % U | 0.0013 | 0.00256 | 0.000401 | 1.61E−07 | 0.0013 |
| % Zn | 0.282 | 0.336 | 0.256 | 0.0659 | 1.03 |
| % Zr | 1.800 | 1.502 | 0.0988 | 0.00977 | 0.33 |
| % P | 0.47 | 0.621 | 0.156 | 0.0245 | 0.464 |
| % F | 0.02 | 0.05 | 7.04E−10 | 4.96E−19 | 0 |
| % Cl | 0.68 | 0.606 | 0.2709 | 0.0734 | 0.999 |
| % O | 52 | 80.8 | 17.905 | 320.6 | 68 |
| % N | 10 | 15 | 6.68 | 44.7 | 24 |
| % Purity | 99.9909 | 99.99132 | 0.000936 | 8.76E−07 | 0.0038 |

TABLE 2

| | Ingot Sample | Top #1 Middle #1 Bottom #1 | Top #2 Middle #2 Bottom #2 | Top #3 Middle #3 Bottom #3 | Top #4 Middle #4 Bottom #4 | Top #5 Middle #5 Bottom #5 |
|---|---|---|---|---|---|---|
| % V | 7.10 | 7.07 | 6.92 | 7.03 | 7.03 | 7.00 |
| | | 7.01 | 7.02 | 7.00 | 7.05 | 7.02 |
| | | 7.00 | 7.07 | 6.94 | 6.93 | 6.92 |
| % Ag | 0.180 | 0.450 | 0.290 | 0.350 | 0.390 | 0.270 |
| | | 0.302 | 0.290 | 0.340 | 0.520 | 0.320 |
| | | 0.312 | 0.273 | 0.237 | 0.136 | 0.350 |
| % Al | 15.600 | 12.500 | 12.300 | 12.700 | 12.300 | 11.300 |
| | | 12.800 | 11.800 | 12.800 | 13.800 | 12.600 |
| | | 13.100 | 12.900 | 12.200 | 11.500 | 12.800 |
| % As | 0.032 | 0.035 | 0.015 | 0.020 | 0.020 | 0.032 |
| | | 0.017 | 0.037 | 0.033 | 0.032 | 0.040 |
| | | 0.037 | 0.016 | 0.014 | 0.026 | 0.025 |
| % B | 0.239 | 0.050 | 0.025 | 0.022 | 0.110 | 0.020 |
| | | 0.033 | 0.122 | 0.167 | 0.085 | 0.040 |
| | | 0.260 | 0.020 | 0.041 | 0.162 | 0.058 |
| % Be | <0.005 | <0.010 | <0.010 | <0.010 | <0.010 | <0.010 |
| | | <0.010 | <0.010 | <0.010 | <0.010 | <0.010 |
| | | <0.010 | <0.010 | <0.010 | <0.010 | <0.010 |
| % Bi | 0.030 | 0.041 | 0.030 | 0.028 | 0.033 | 0.031 |
| | | 0.034 | 0.037 | 0.031 | 0.030 | 0.030 |
| | | 0.034 | 0.027 | 0.034 | 0.041 | 0.040 |
| % Ca | 0.030 | 0.020 | <0.020 | 0.038 | 0.060 | 0.050 |
| | | 0.058 | 0.097 | 0.130 | 0.037 | 0.050 |
| | | 0.080 | 0.028 | 0.029 | 0.036 | 0.050 |
| % Cd | <0.050 | 0.140 | 0.060 | 0.078 | 0.070 | <0.050 |
| | | 0.080 | 0.190 | 0.060 | 0.170 | 0.070 |
| | | 0.100 | <0.050 | <0.050 | <0.050 | 0.095 |
| % Co | 27.400 | 25.500 | 25.400 | 25.600 | 25.600 | 25.700 |
| | | 25.800 | 25.700 | 26.200 | 26.300 | 31.700 |
| | | 25.400 | 27.700 | 25.200 | 26.600 | 24.700 |
| % Cr | 12.300 | 11.300 | 11.600 | 11.400 | 11.500 | 11.100 |
| | | 11.600 | 11.300 | 12.000 | 12.400 | 11.900 |
| | | 11.200 | 12.300 | 11.100 | 11.100 | 11.700 |
| % Cu | 0.372 | 0.370 | 0.320 | 0.440 | 0.334 | 0.390 |
| | | 0.290 | 1.800 | 0.400 | 0.410 | 0.380 |
| | | 0.310 | 0.383 | 0.328 | 0.403 | 0.350 |
| % Fe | 9.080 | 8.800 | 8.850 | 8.600 | 8.600 | 8.800 |
| | | 8.600 | 8.900 | 9.200 | 8.900 | 8.600 |
| | | 10.700 | 9.540 | 8.610 | 8.710 | 8.500 |

TABLE 2-continued

| | Ingot Sample | Top #1 Middle #1 Bottom #1 | Top #2 Middle #2 Bottom #2 | Top #3 Middle #3 Bottom #3 | Top #4 Middle #4 Bottom #4 | Top #5 Middle #5 Bottom #5 |
|---|---|---|---|---|---|---|
| % Ga | <0.040 | <0.040 | <0.040 | <0.040 | <0.040 | <0.040 |
| | | <0.040 | <0.040 | <0.040 | <0.040 | <0.040 |
| | | <0.040 | <0.040 | <0.040 | <0.040 | <0.040 |
| % In | <0.030 | <0.030 | <0.030 | <0.030 | <0.030 | <0.030 |
| | | <0.030 | <0.030 | <0.030 | <0.030 | <0.030 |
| | | <0.030 | <0.030 | <0.030 | <0.030 | <0.030 |
| % K | 0.034 | 0.050 | <0.010 | 0.016 | 0.040 | 0.035 |
| | | 0.030 | 0.025 | 0.070 | 0.090 | 0.060 |
| | | 0.090 | 0.016 | 0.016 | 0.022 | 0.020 |
| % Li | <0.005 | <0.010 | <0.010 | <0.010 | <0.010 | <0.010 |
| | | <0.010 | <0.010 | <0.010 | <0.010 | <0.010 |
| | | <0.010 | <0.010 | <0.010 | <0.010 | <0.010 |
| % Mg | 1.520 | 1.300 | 1.400 | 1.200 | 1.100 | 1.300 |
| | | 1.200 | 1.100 | 1.200 | 1.300 | 1.100 |
| | | 1.100 | 1.360 | 1.090 | 1.310 | 1.100 |
| % Mn | 0.080 | 0.073 | 0.073 | 0.074 | 0.065 | 0.076 |
| | | 0.080 | 0.090 | 0.077 | 0.070 | 0.060 |
| | | 0.088 | 0.066 | 0.062 | 0.068 | 0.072 |
| % Mo | 0.944 | 1.100 | 1.100 | 1.100 | 1.100 | 0.850 |
| | | 1.100 | 1.100 | 1.000 | 1.200 | 1.100 |
| | | 1.100 | 1.260 | 1.100 | 1.140 | 1.300 |
| % Na | 0.221 | 0.310 | 0.170 | 0.270 | 0.300 | 0.200 |
| | | 0.170 | 0.280 | 0.350 | 0.200 | 0.250 |
| | | 0.340 | 0.228 | 0.390 | 0.274 | 0.124 |
| % Pb | 0.191 | 0.210 | 0.210 | 0.170 | 0.200 | 0.150 |
| | | 0.190 | 0.260 | 0.200 | 0.210 | 0.190 |
| | | 0.158 | 0.244 | 0.186 | 0.206 | 0.190 |
| % Sb | <0.10 | 0.010 | <0.010 | <0.010 | <0.010 | 0.013 |
| | | <0.010 | 0.020 | <00.10 | 0.018 | <0.010 |
| | | 0.012 | <0.010 | <0.010 | <0.010 | <0.010 |
| % Si | 19.400 | 29.500 | 18.300 | 20.500 | 22.900 | 18.000 |
| | | 19.500 | 22.100 | 26.000 | 29.000 | 23.300 |
| | | 25.200 | 18.700 | 17.300 | 18.200 | 19.300 |
| % Sn | 0.066 | 0.070 | 0.050 | <0.050 | <0.050 | <0.050 |
| | | <0.050 | 1.400 | 0.070 | 0.100 | 0.085 |
| | | 0.090 | <0.050 | 0.050 | 0.058 | <0.050 |
| % Th | 0.7 ppb | 0.95 ppb | 0.80 ppb | 0.40 ppb | 0.60 ppb | 0.60 ppb |
| | | 0.60 ppb | 0.60 ppb | 0.50 ppb | 2.20 ppb | 0.70 ppb |
| | | 0.50 ppb | 0.40 ppb | 0.80 ppb | 0.60 ppb | 0.50 ppb |
| % Ti | 1.160 | 1.500 | 1.300 | 1.300 | 1.300 | 1.100 |
| | | 1.300 | 1.300 | 1.400 | 1.500 | 1.200 |
| | | 3.600 | 1.220 | 1.180 | 1.350 | 1.300 |
| % U | 1.3 ppb | 3.40 ppb | 2.20 ppb | 2.80 ppb | 2.40 ppb | 2.10 ppb |
| | | 2.40 ppb | 2.10 ppb | 3.20 ppb | 3.00 ppb | 2.60 ppb |
| | | 2.60 ppb | 2.30 ppb | 2.20 ppb | 2.80 ppb | 2.40 ppb |
| % Zn | 0.282 | 0.230 | 0.300 | 0.230 | 0.270 | 0.240 |
| | | 0.190 | 0.571 | 0.300 | 0.330 | 0.230 |
| | | 1.200 | 0.262 | 0.204 | 0.326 | 0.170 |
| % Zr | 1.800 | 1.700 | 1.500 | 1.500 | 1.500 | 1.400 |
| | | 1.600 | 1.400 | 1.600 | 1.600 | 1.400 |
| | | 1.500 | 1.440 | 1.370 | 1.420 | 1.600 |
| % P | 0.47 | 0.91 | 0.48 | 0.53 | 0.61 | 0.47 |
| | | 0.45 | 0.65 | 0.82 | 0.88 | 0.56 |
| | | 0.80 | 0.52 | 0.48 | 0.60 | 0.57 |
| % F | <0.02 | <0.05 | <0.05 | <0.05 | <0.05 | <0.05 |
| | | <0.05 | <0.05 | <0.05 | <0.05 | <0.05 |
| | | <0.05 | <0.05 | <0.05 | <0.05 | <0.05 |
| % Cl | 0.68 | 0.49 | <0.00 | 0.27 | 0.96 | 0.49 |
| | | 0.43 | 0.95 | 0.81 | 1.00 | 0.50 |
| | | 0.66 | 0.57 | 0.73 | 0.71 | 0.52 |
| % O | 52 | 106 | 72 | 81 | 122 | 80 |
| | | 63 | 78 | 54 | 72 | 98 |
| | | 92 | 83 | 61 | 81 | 69 |
| % N | 10 | 12 | 14 | 14 | 11 | 14 |
| | | 14 | 12 | 8 | 14 | 7 |
| | | 13 | 12 | 31 | 21 | 28 |
| % Purity | 99.9909 | 99.9905 | 99.9917 | 99.9940 | 99.9912 | 99.9919 |
| | | 99.9915 | 99.9910 | 99.9906 | 99.9902 | 99.9905 |
| | | 99.9904 | 99.9912 | 99.9919 | 99.9917 | 99.9916 |

Example 2

Various rolling and recrystallization techniques were investigated for determining the optimum procedure for the reduction of grain size in Ni/7%V sputter targets. Using 7 inch diameter, 1.75 inch thick target blanks melted and cast by the method of Example 1, the techniques evaluated included cold rolling with prior homogenization at 1155° C. for 24 hours, cold rolling without prior homogenization, hot rolling at 600° C., hot rolling at 800° C., and hot rolling at 1000° C. The rolling was carried out to achieve a 68% reduction in thickness. The cold rolled and hot rolled target blanks were subjected to recrystallization at 850° C. for 1, 2, 3 and 4 hours. Table 3 summarizes the techniques described above.

TABLE 3

| Target Blank | Homogenization at 1155° C. for 24 hours | Rolling Temperature for 68% Reduction | Time of Recrystallization at 850° C. |
|---|---|---|---|
| 1 | yes | room temp. | 1, 2, 3, and 4 hrs. |
| 2 | no | room temp. | 1, 2, 3, and 4 hrs. |
| 3 | no | 600° C. | 1, 2, 3, and 4 hrs. |
| 4 | no | 800° C. | 1, 2, 3, and 4 hrs. |
| 5 | no | 1000° C. | 1, 2, 3, and 4 hrs. |

Figure 4:
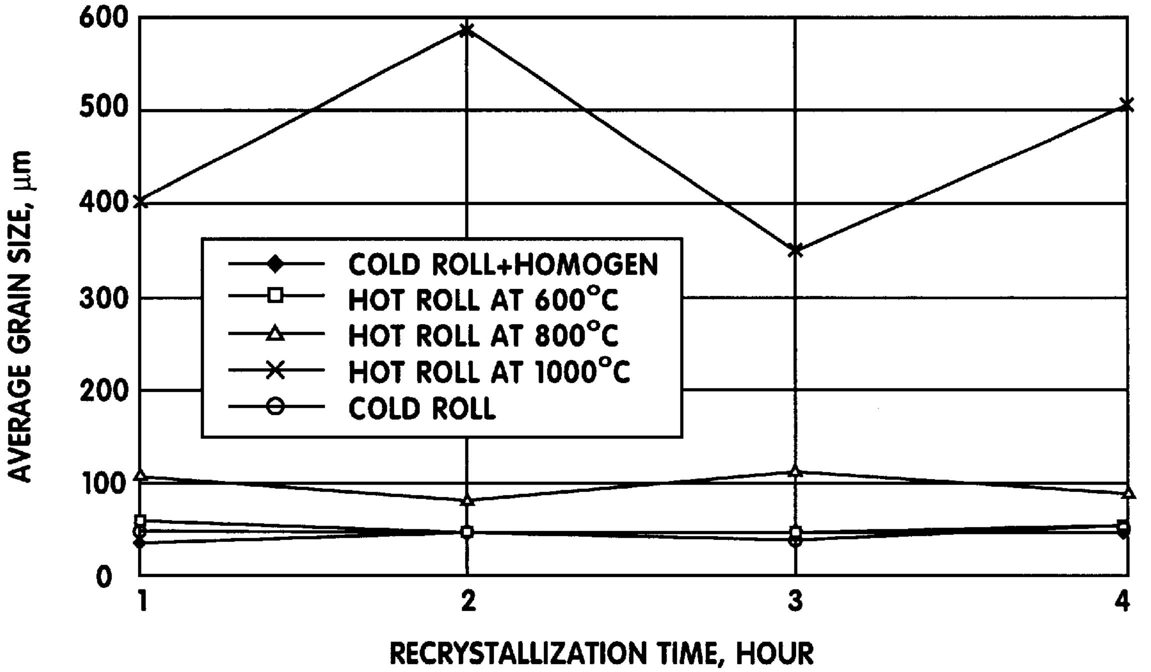
FIG. 4 is a plot of re-crystallization time versus average grain size.
Figure 5:
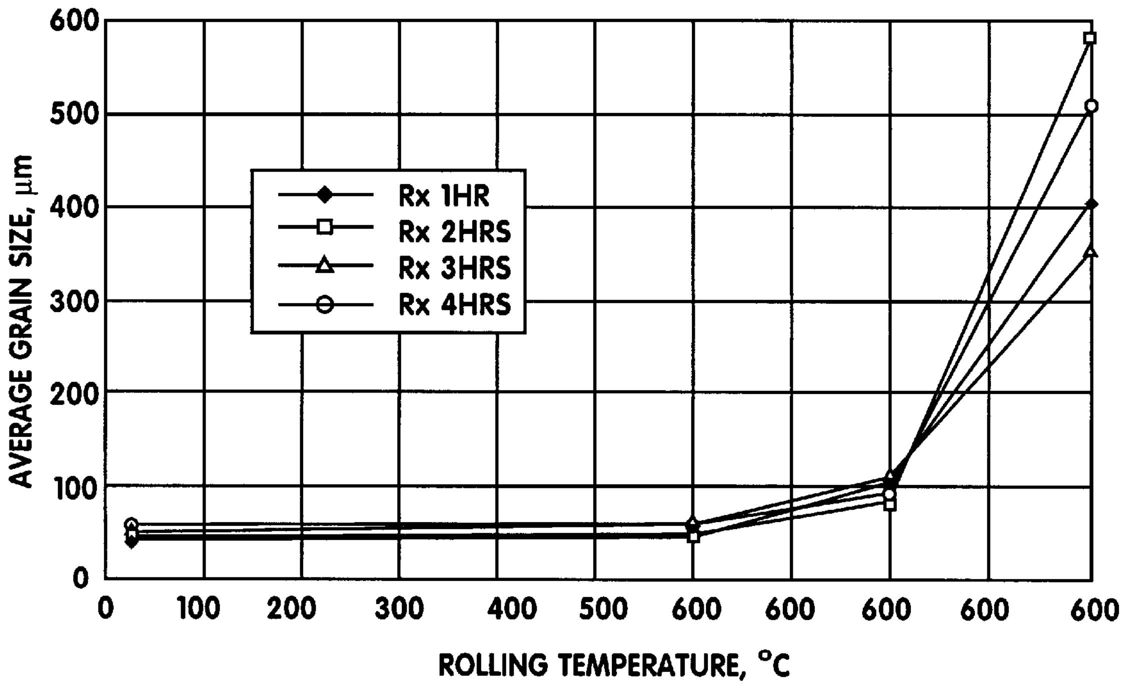
FIG. 5 is a plot of rolling temperature versus average grain size.

The sample target blanks were examined on the top horizontal surface and the cross-sectional vertical surface under an optical microscope. Grain sizes were determined according to the ASTM E112-77 standard. Average grain sizes were determined by taking an average of readings of the normal and parallel measurements of each of the surfaces. The effect of the recrystallization time and rolling temperature on grain size are shown in FIGS. 4 and 5, respectively. The time of recrystallization varying from 1 to 4 hours has only a small effect on the grain size. Variations in rolling temperature, however, produce greater changes in the grain size. Higher rolling temperatures tend to produce larger grain sizes. The typical grain size of all 4 recrystallization times for cold rolling with prior homogenization, cold rolling without prior homogenization, hot rolling at 600° C., hot rolling at 800° C., and hot rolling at 1000° C. are 47 $\mu$m, 48 $\mu$m, 54 $\mu$m, 99 $\mu$m and 462 $\mu$m, respectively. Thus, the grain sizes for cold rolling with or without prior homogenization and hot rolling at 600° C. are similar, ranging from 47–54 $\mu$m. Partially recrystallized grain was noted to break up during hot rolling at 800° C. Huge cast grain structures were retained during hot rolling at 1000° C. Surface cracks were noted during hot rolling at 600° C. and 800° C., but cracks were not visible during cold rolling and hot rolling at 1000° C. In view of these results, it is preferred that 7 inch diameter, 1.75 inch thick target blanks be cold rolled without prior homogenization, followed by recrystallization at 850° C. for 1–4 hours.

Example 3

Three RMX12 targets (12 inch diameter, rotating magnet non-aluminum targets), melted and cast by the method of Example 1, were fabricated from 7.25 inch diameter, 1.75 inch thick target blanks by the following processes:

(1) Cold cross-rolled (fine grain): cold rolling at room temperature with approximately 45°–90° rotation after each pass to maintain a circular shape until the final thickness of about 0.449 inch, followed by recrystallization at 850° C. for 3 hours.

(2) Cold directional-rolled (fine grain): cold rolling in one direction until the width reaches an intermediate thickness, then cross rolling to a circular shape and final thickness of about 0.449 inch, followed by recrystallization at 850° C. for 3 hours.

(3) Hot directional-rolled (course grain): hot rolling at 1000° C. in one direction until the width reaches an intermediate thickness, then cross rolling to a circular shape and final thickness of about 0.449 inch, followed by recrystallization at 850° C. for 3 hours.

Figure 6:
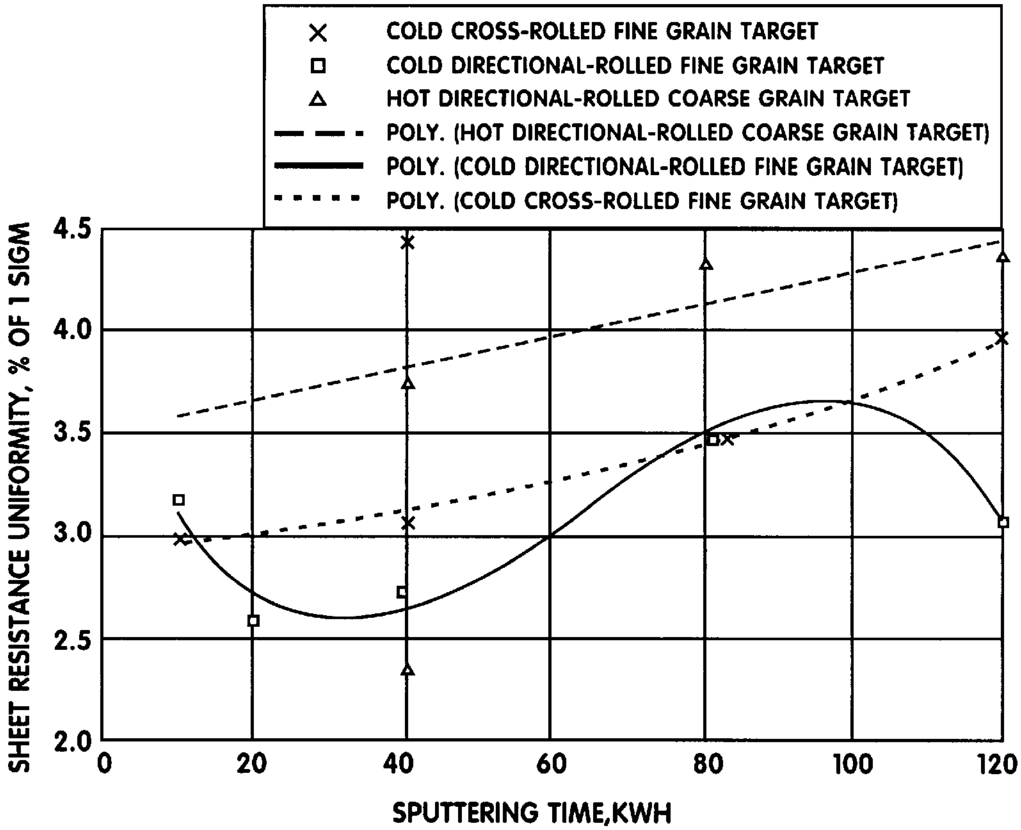
FIG. 6 is a plot of sputtering time versus sheet resistance uniformity (average of 3 measurements) as a function of rolling process and temperature.
Figure 7:
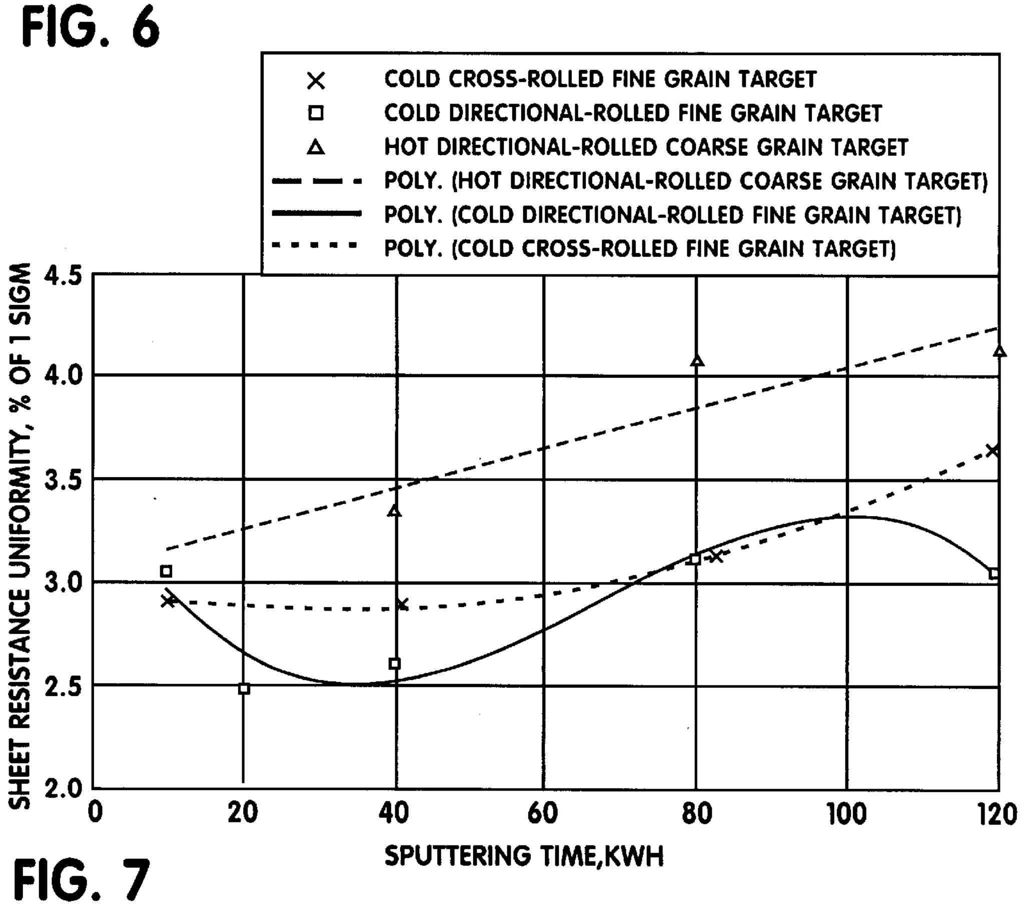
FIG. 7 is a plot of sputtering time versus sheet resistance uniformity (average of last 2 measurements) as a function of the rolling process and temperature.

The three targets were sputtered to 10, 20, 40, 80 and 120 KWH. Thin films were deposited on three 6 inch wafers from each target. Sheet resistance (Rs) uniformity was then measured on each wafer. (Average of 49 locations using a four-point probe). The average Rs uniformity of the 3 measurements and that of the last 2 measurements are depicted in FIGS. 6 and 7, respectively. After each burn-in, the first sputtered wafer always has higher values of Rs uniformity than the two subsequent measurements. It is believed that this is caused by oxidation on the target surface during transfer from the burn-in test stand to the sputter chamber. It is therefore concluded that the last 2 measurements represent a more realistic indication of performance of the target.

Rs uniformity of the hot directional-rolled coarse grain target is higher than those of the two fine grain targets by approximately 1.2 times, and it increases with higher KWH. The Rs uniformity of the cold cross-rolled fine grain target also exhibits an increasing trend with KWH. The Rs uniformity of the cold directional-rolled fine grain target displays an initial decrease, an increase until 80 KWH, and then a decrease to 120 KVH. The cold directional-rolled fine grain target thus appears to be the target with the best performance.

Example 4

Alpha count analysis was conducted at Idaho National Engineering Laboratory in a large-area Frisch-grid ionization chamber alpha spectrometer. The counting gas was 90% Ar-10% $CH_4$ (P-10 gas) at 35 kPa. The alpha spectrometer was operated with a 8,192 channel multi-channel analyzer. The gain was chosen to cover the alpha particle energy range of 1–8 MeV. The chamber was energy calibrated prior to an immediately following each sample analysis. This was accomplished analyzing a standard plate having $^{230}$Th, $^{239}$Pu and $^{244}$Cm deposited on its surface. These three isotopes emit alpha particles with energies of 4.688, 5.155 and 5.805 MeV. Each of the three spectral peaks was fit with a Gaussian function of variable width using nonlinear least squares fitting techniques. Each peak fit determines the centroid of the alpha peak. The centroids of the three peaks and their corresponding energies were used to determine the zero and gain of the spectrometer.

The sample to be analyzed, having a maximum size of 10 inches in diameter and ⅛ inch in thickness was placed in the chamber. The chamber was evacuated to 0.25 mm Hg and then filled with P-10 gas to 35 kPa. The chamber high voltage was raised to plus 3,000 V. Alpha counting for each sample was conducted for 7 days, 24 hours a day. Each spectrum was analyzed for $^{239}$Pu, $^{244}$Cm and 22 naturally occurring alpha-emitting isotopes from the 9 elements of curium, thorium, uranium, radium, protactinium, polonium, plutonium, radon, and bismuth. The alpha-emitting isotopes under analysis are listed in Table 4.

TABLE 4

| Bi | Cm | Po | Pu. | Pa | Ra | Rn | Th | U |
|---|---|---|---|---|---|---|---|---|
| Bi-212 | Cm-244* | Po-218 | Pu-239* | Pa-231 | Ra-226 | Rn-222 | Th-232 | U-238 |
| Bi-211 | | Po-216 | | | Ra-224 | Rn-220 | Th-230 | U-235 |
| | | Po-215 | | | Ra-223 | Rn-219 | Th-228 | U-234 |
| | | Po-214 | | | | | Th-227 | |
| | | Po-212 | | | | | | |
| | | Po-211 | | | | | | |
| | | Po-210 | | | | | | |

*man-made alpha-emitting isotope

The spectral analysis program forces a fit of a fixed-width Gaussian to the sample spectral data at 24 locations in the spectrum corresponding to the energies of the alpha particles emitted by $^{239}$Pu, $^{244}$Cm and the 22 naturally occurring isotopes. The spectral analysis program performs a linear least square fit of a straight line to background spectral data. These contamination levels are expressed as alphas/cm$^2$-hr. The alpha emissions are reported as total emission and net emission of naturally occurring isotopes after background emission was deducted. Negative value of net alpha emission rate was calculated in some cases. The negative value represents a background alpha count that is higher than the alpha count at the respective isotope peak of the sample. This negative net alpha emission rate indicates a very low level of emission and the result is statistically equal to zero alpha/cm$^2$-hr.

Table 5 reports the total alpha emission rate for the sample, which is the sum of the emission rates for all 24 isotopes. The sample prepared by the method of the present invention has an ultra-low alpha emission level of $-6.69\times10^{-4}$ alpha counts/cm$^2$-hr. Table 5 also provides a second total alpha emission rate for the sample of alpha emitting isotopes existing in nature, which is the sum of the emission rates for each isotope omitting the emission rates for the two man-made isotopes, $^{239}$Pu and $^{244}$Cm. This alpha

TABLE 5

| Isotope | Alpha Emission Rate (alpha/cm$^2$-hr) |
|---|---|
| U-234 | 2.36E-03 |
| U-235 | 2.10E-03 |
| Pa-231 | 1.95E-03 |
| Po-216 | 1.28E-03 |
| Po-215 | 9.00E-04 |
| Po-218 | 5.36E-04 |
| Ra-226 | 5.27E-04 |
| Po-214 | 4.35E-04 |
| Cm-244 | 3.80E-04 |
| Pu-239 | 3.66E-04 |
| U-238 | 2.81E-04 |
| Th-232 | 2.86E-05 |
| Rn-220 | −1.41E-04 |
| Th-228 | −1.43E-04 |
| Rn-222 | −3.97E-04 |
| Ra-223 | −4.21E-04 |
| Ra-224 | −4.27E-04 |
| Bi-211 | −4.67E-04 |
| Th-227 | 4.69E-04 |
| Po-211 | 5.02E-04 |
| Bi-212 | −6.82E-04 |
| Rn-219 | −1.04E-03 |
| Th-230 | −3.48E-03 |
| Po-210 | −3.63E-03 |
| Total | −6.69E-03 |
| Total less Pu-239 and Cm-244 | −1.41E-03 |

While the present invention has been illustrated by the description of an embodiment thereof, and while the embodiment has been described in considerable detail, it is not intended to restrict or in any way limit the scope of the appended claims to such detail. Additional advantages and modifications will readily appear to those skilled in the art. The invention in its broader aspects is therefore not limited to the specific details, representative apparatus and method and illustrative examples shown and described. Accordingly, departures may be made from such details without departing from the scope or spirit of applicant's general inventive concept.

What is claimed is:

1. A process for manufacturing a nickel/vanadium sputter target having ultra-low alpha emission, comprising the steps of:

melting nickel and vanadium source materials under a high vacuum and low pressure atmosphere to form a molten alloy and to reduce alpha emissions, wherein nickel source material is at least 99.98% pure with an alpha emission equal or less than about $1.2\times10^{-2}$ counts/cm$^2$-hr and the vanadium source material is at least about 99.5% pure with an alpha emission equal to or less than about $2.7\times10^{-2}$ counts/cm$^2$-hr;

casting the molten alloy in a mold under a vacuum and low pressure atmosphere to reduce alpha emission and to form an alloy target blank, the target blank having an alpha emission equal to or less than about $10^{-2}$ counts/cm$^2$-hr; and rolling to a thickness reduction of about 50% to about 95% and annealing the target blank to further reduce alpha emissions and to form a sputter target having an alpha emission of equal to or less than $10^{-3}$ counts/cm$^2$-hr.

2. The process of claim 1, wherein the source materials are melted under a high vacuum of about $1.0\times10^{-4}$ mTorr to about 10.0 mTorr and a low pressure argon atmosphere of about 0.1 to about 0.7 atm. in a semi-continuous vacuum melter.

3. The process of claim 2, wherein the source materials are melted under a high vacuum of about 1.0 mTorr to about 5.0 mTorr and a low pressure argon atmosphere of about 0.3 atm. in a semi-continuous vacuum melter.

4. The process of claim 1, wherein the molten alloy is cast in a semi-continuous vacuum melter under a low pressure argon atmosphere of about 0.1 to about 0.7 atm.

5. The process of claim 4, wherein the molten alloy is cast in a semi-continuous vacuum melter under a low pressure argon atmosphere of about 0.3 atm.

6. The process of claim 1, wherein the molten alloy is cast into a mold selected from the group consisting of: steel, graphite and ceramic.

7. The process of claim 1, wherein the alloy target blank is formed having a diameter of about 7.0 inches to about 7.375 inches and a thickness of about 1.625 inches to about 1.875 inches.

8. The process of claim 1, wherein the rolled alloy target blank is annealed at a temperature of about 600–1000° C. for a period of about 30 minutes to about 6 hours.

9. The process of claim 1, wherein the alloy target blank is hot rolled at a temperature of 500–1200° C. to form a fine grain structure.

10. The process of claim 1, wherein the alloy target blank is cold rolled to form a fine grain structure.

11. The process of claim 10, wherein the alloy target blank is rolled in one direction to an intermediate thickness, and then cross-rolled with about a 45–90 degree rotation after each roll to a final thickness and circular shape to form a fine grain structure.

12. The process of claim 10, wherein the alloy target blank is cross-rolled with about a 45–90 degree rotation after each roll to a final thickness and circular shape.

13. The process of claim 8, wherein the alloy target blank is rolled in one direction to an intermediate thickness, and then cross-rolled with about a 45–90 degree rotation after each roll to a final thickness and circular shape to form a fine grain structure.

14. The process of claim 1, wherein the alloy target blank is cross-rolled with about a 45–90 degree rotation after each roll to a final thickness and circular shape to form a fine grain structure.

15. A process for manufacturing a nickel/vanadium sputter target having ultra-low alpha emission, comprising the steps of:

melting nickel and vanadium source materials under a high vacuum of about $1.0\times10^{-4}$ mTorr to about 10.0 mTorr and a low pressure argon atmosphere of about 0.1 to about 0.7 atm. in a semi-continuous vacuum melter to form a molten alloy, wherein nickel source material is at least 99.98% pure with an alpha emission equal or less than about $1.2\times10^{-2}$ counts/$cm^2$-hr and the vanadium source material is at least about 99.5% pure with an alpha emission equal to or less than about $2.7\times10^{-2}$ counts/$cm^2$-hr;

casting the molten alloy into a mold under a low pressure argon atmosphere of about 0.1 to about 0.7 atm. in a semi-continuous vacuum melter to reduce alpha emission and to form an alloy target blank, the target blank having an alpha emission equal to or less than about $10^{-2}$ counts/$cm^2$-hr; and rolling the alloy target blank to a thickness reduction of about 50% to about 95% to form a final thickness and annealing the rolled alloy target blank at a temperature of about 600–1000° C. for a period of about 30 minutes to about 6 hours to further reduce alpha emissions and to form a sputter target, the sputter target having an alpha emission equal or less than $10^{-3}$ counts/$cm^2$-hr.

16. The process of claim 15, wherein the source materials are melted under a high vacuum of about 1.0 mTorr to about 5.0 mTorr and a low pressure argon atmosphere of about 0.3 atm.

17. The process of claim 15, wherein the molten alloy is cast under a low pressure argon atmosphere of about 0.3 atm.

18. The process of claim 15, wherein the molten alloy is cast into a mold selected from the group consisting of: steel, graphite and ceramic.

19. The process of claim 15, wherein the alloy target blank is hot rolled at a temperature of 500–1200° C. to form a fine grain structure.

20. The process of claim 15, wherein the alloy target blank is cold rolled to form a fine grain structure.

21. The process of claim 20, wherein the alloy target blank is rolled in one direction to an intermediate thickness, and then cross-rolled with about a 45–90 degree rotation after each roll to a final thickness and circular shape to form a fine grain structure.

22. The process of claim 20, wherein the alloy target blank is cross-rolled with about a 45–90 degree rotation after each roll to a final thickness and circular shape to form a fine grain structure.

23. The process of claim 15, wherein the alloy target blank is rolled in one direction to an intermediate thickness, and then cross-rolled with about a 45–90 degree rotation after each roll to a final thickness and circular shape to form a fine grain structure.

24. The process of claim 15, wherein the alloy target blank is cross-rolled with about a 45–90 degree rotation after each roll to a final thickness and circular shape to form a fine grain structure.

* * * * *